US008981602B2

(12) United States Patent
Salter et al.

(10) Patent No.: US 8,981,602 B2
(45) Date of Patent: Mar. 17, 2015

(54) PROXIMITY SWITCH ASSEMBLY HAVING NON-SWITCH CONTACT AND METHOD

(75) Inventors: Stuart C. Salter, White Lake, MI (US); Pietro Buttolo, Dearborn Heights, MI (US); Cornel Lewis Gardner, Romulus, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 540 days.

(21) Appl. No.: 13/482,222

(22) Filed: May 29, 2012

(65) Prior Publication Data

US 2013/0321065 A1 Dec. 5, 2013

(51) Int. Cl.
*H03K 17/96* (2006.01)
*G01N 27/00* (2006.01)

(52) U.S. Cl.
CPC .. *H03K 17/9622* (2013.01); *H03K 2217/94036* (2013.01); *H03K 2217/960705* (2013.01)
USPC ........................................................ 307/650

(58) Field of Classification Search
USPC ........................................................ 307/650
See application file for complete search history.

(56) References Cited

U.S. PATENT DOCUMENTS

| 3,382,588 A | 5/1968 | Serrell et al. |
| 3,544,804 A | 12/1970 | Gaumer et al. |
| 3,691,396 A | 9/1972 | Hinrichs |
| 3,707,671 A | 12/1972 | Morrow et al. |
| 3,826,979 A | 7/1974 | Steinmann |
| 4,204,204 A | 5/1980 | Pitstick |
| 4,205,325 A | 5/1980 | Haygood et al. |
| 4,232,289 A | 11/1980 | Daniel |
| 4,257,117 A | 3/1981 | Besson |
| 4,290,052 A | 9/1981 | Eichelberger et al. |
| 4,340,813 A | 7/1982 | Sauer |
| 4,374,381 A | 2/1983 | Ng et al. |
| 4,380,040 A | 4/1983 | Posset |

(Continued)

FOREIGN PATENT DOCUMENTS

| DE | 4024052 | 1/1992 |
| EP | 1152443 | 11/2001 |

(Continued)

OTHER PUBLICATIONS

U.S. Appl. No. 13/609,390, filed Sep. 11, 2012, entitled "Proximity Switch Based Door Latch Release," (14 pages of specification and 4 pages of drawings) and Official Filing Receipt (3 pages).

(Continued)

*Primary Examiner* — Robert Deberadinis
(74) *Attorney, Agent, or Firm* — Vichit Chea; Price Heneveld LLP

(57) ABSTRACT

A proximity switch assembly includes first and second proximity switches comprising first and second proximity sensors and a tactile feature disposed between the first and second proximity switches. The assembly also includes controlling circuitry detecting an object on the tactile feature based on sensed signals from the first and second proximity sensors and preventing activation of the first and second switches when an object is detected on the tactile feature. The assembly further includes a resting pad having a third sensor, wherein the control circuitry detects an object with the first sensor and an object on the resting pad and determines activation of the first and second proximity switches based on the detected objects.

20 Claims, 6 Drawing Sheets

(56) References Cited

U.S. PATENT DOCUMENTS

| | | | |
|---|---|---|---|
| 4,413,252 A | 11/1983 | Tyler et al. |
| 4,431,882 A | 2/1984 | Frame |
| 4,446,380 A | 5/1984 | Moriya et al. |
| 4,453,112 A | 6/1984 | Sauer et al. |
| 4,492,958 A | 1/1985 | Minami |
| 4,494,105 A | 1/1985 | House |
| 4,502,726 A | 3/1985 | Adams |
| 4,514,817 A | 4/1985 | Pepper et al. |
| 4,613,802 A | 9/1986 | Kraus et al. |
| 4,680,429 A | 7/1987 | Murdock et al. |
| 4,743,895 A | 5/1988 | Alexander |
| 4,748,390 A | 5/1988 | Okushima et al. |
| 4,758,735 A | 7/1988 | Ingraham |
| 4,821,029 A | 4/1989 | Logan et al. |
| 4,855,550 A | 8/1989 | Schultz, Jr. |
| 4,872,485 A | 10/1989 | Laverty, Jr. |
| 4,899,138 A | 2/1990 | Araki et al. |
| 4,901,074 A | 2/1990 | Sinn et al. |
| 4,905,001 A | 2/1990 | Penner |
| 4,924,222 A | 5/1990 | Antikidis et al. |
| 4,972,070 A | 11/1990 | Laverty, Jr. |
| 5,025,516 A | 6/1991 | Wilson |
| 5,033,508 A | 7/1991 | Laverty, Jr. |
| 5,036,321 A | 7/1991 | Leach et al. |
| 5,063,306 A | 11/1991 | Edwards |
| 5,108,530 A | 4/1992 | Niebling, Jr. et al. |
| 5,153,590 A | 10/1992 | Charlier |
| 5,159,159 A | 10/1992 | Asher |
| 5,159,276 A | 10/1992 | Reddy, III |
| 5,177,341 A | 1/1993 | Balderson |
| 5,215,811 A | 6/1993 | Reafler et al. |
| 5,239,152 A | 8/1993 | Caldwell et al. |
| 5,270,710 A | 12/1993 | Gaultier et al. |
| 5,294,889 A | 3/1994 | Heep et al. |
| 5,329,239 A | 7/1994 | Kindermann et al. |
| 5,341,231 A | 8/1994 | Yamamoto et al. |
| 5,403,980 A | 4/1995 | Eckrich |
| 5,451,724 A | 9/1995 | Nakazawa et al. |
| 5,467,080 A | 11/1995 | Stoll et al. |
| 5,477,422 A | 12/1995 | Hooker et al. |
| 5,494,180 A | 2/1996 | Callahan |
| 5,512,836 A | 4/1996 | Chen et al. |
| 5,548,268 A | 8/1996 | Collins |
| 5,566,702 A | 10/1996 | Philipp |
| 5,572,205 A | 11/1996 | Caldwell et al. |
| 5,586,042 A | 12/1996 | Pisau et al. |
| 5,594,222 A | 1/1997 | Caldwell |
| 5,598,527 A | 1/1997 | Debrus et al. |
| 5,670,886 A | 9/1997 | Wolff et al. |
| 5,681,515 A | 10/1997 | Pratt et al. |
| 5,730,165 A | 3/1998 | Philipp |
| 5,747,756 A | 5/1998 | Boedecker |
| 5,760,554 A | 6/1998 | Bustamante |
| 5,790,107 A | 8/1998 | Kasser et al. |
| 5,796,183 A | 8/1998 | Hourmand |
| 5,825,352 A | 10/1998 | Bisset et al. |
| 5,827,980 A | 10/1998 | Doemens et al. |
| 5,864,105 A | 1/1999 | Andrews |
| 5,867,111 A | 2/1999 | Caldwell et al. |
| 5,874,672 A | 2/1999 | Gerardi et al. |
| 5,917,165 A | 6/1999 | Platt et al. |
| 5,920,309 A | 7/1999 | Bisset et al. |
| 5,942,733 A | 8/1999 | Allen et al. |
| 5,963,000 A | 10/1999 | Tsutsumi et al. |
| 5,973,417 A | 10/1999 | Goetz et al. |
| 5,973,623 A | 10/1999 | Gupta et al. |
| 6,010,742 A | 1/2000 | Tanabe et al. |
| 6,011,602 A | 1/2000 | Miyashita et al. |
| 6,031,465 A | 2/2000 | Burgess |
| 6,035,180 A | 3/2000 | Kubes et al. |
| 6,037,930 A | 3/2000 | Wolfe et al. |
| 6,040,534 A | 3/2000 | Beukema |
| 6,157,372 A | 12/2000 | Blackburn et al. |
| 6,172,666 B1 | 1/2001 | Okura |
| 6,215,476 B1 | 4/2001 | Depew et al. |
| 6,219,253 B1 | 4/2001 | Green |
| 6,231,111 B1 | 5/2001 | Carter et al. |
| 6,275,644 B1 | 8/2001 | Domas et al. |
| 6,288,707 B1 | 9/2001 | Philipp |
| 6,292,100 B1 | 9/2001 | Dowling |
| 6,310,611 B1 | 10/2001 | Caldwell |
| 6,320,282 B1 | 11/2001 | Caldwell |
| 6,323,919 B1 | 11/2001 | Yang et al. |
| 6,369,369 B2 | 4/2002 | Kochman et al. |
| 6,377,009 B1 | 4/2002 | Philipp |
| 6,379,017 B2 | 4/2002 | Nakabayashi et al. |
| 6,380,931 B1 | 4/2002 | Gillespie et al. |
| 6,415,138 B2 | 7/2002 | Sirola et al. |
| 6,427,540 B1 | 8/2002 | Monroe et al. |
| 6,452,138 B1 | 9/2002 | Kochman et al. |
| 6,452,514 B1 | 9/2002 | Philipp |
| 6,456,027 B1 | 9/2002 | Pruessel |
| 6,457,355 B1 | 10/2002 | Philipp |
| 6,464,381 B2 | 10/2002 | Anderson, Jr. et al. |
| 6,466,036 B1 | 10/2002 | Philipp |
| 6,485,595 B1 | 11/2002 | Yenni, Jr. et al. |
| 6,529,125 B1 | 3/2003 | Butler et al. |
| 6,535,200 B2 | 3/2003 | Philipp |
| 6,537,359 B1 | 3/2003 | Spa |
| 6,559,902 B1 | 5/2003 | Kusuda et al. |
| 6,587,097 B1 | 7/2003 | Aufderheide et al. |
| 6,607,413 B2 | 8/2003 | Stevenson et al. |
| 6,614,579 B2 | 9/2003 | Roberts et al. |
| 6,617,975 B1 | 9/2003 | Burgess |
| 6,639,159 B2 | 10/2003 | Anzai |
| 6,652,777 B2 | 11/2003 | Rapp et al. |
| 6,654,006 B2 | 11/2003 | Kawashima et al. |
| 6,661,410 B2 | 12/2003 | Casebolt et al. |
| 6,664,489 B2 | 12/2003 | Kleinhans et al. |
| 6,713,897 B2 | 3/2004 | Caldwell |
| 6,734,377 B2 | 5/2004 | Gremm et al. |
| 6,738,051 B2 | 5/2004 | Boyd et al. |
| 6,740,416 B1 | 5/2004 | Yokogawa et al. |
| 6,756,970 B2 | 6/2004 | Keely, Jr. et al. |
| 6,773,129 B2 | 8/2004 | Anderson, Jr. et al. |
| 6,774,505 B1 | 8/2004 | Wnuk |
| 6,794,728 B1 | 9/2004 | Kithil |
| 6,795,226 B2 | 9/2004 | Agrawal et al. |
| 6,809,280 B2 | 10/2004 | Divigalpitiya et al. |
| 6,812,424 B2 | 11/2004 | Miyako |
| 6,819,316 B2 | 11/2004 | Schulz et al. |
| 6,819,990 B2 | 11/2004 | Ichinose |
| 6,825,752 B2 | 11/2004 | Nahata et al. |
| 6,834,373 B2 | 12/2004 | Dieberger |
| 6,841,748 B2 | 1/2005 | Serizawa et al. |
| 6,847,018 B2 | 1/2005 | Wong |
| 6,847,289 B2 | 1/2005 | Pang et al. |
| 6,854,870 B2 | 2/2005 | Huizenga |
| 6,879,250 B2 | 4/2005 | Fayt et al. |
| 6,884,936 B2 | 4/2005 | Takahashi et al. |
| 6,891,114 B2 | 5/2005 | Peterson |
| 6,891,530 B2 | 5/2005 | Umemoto et al. |
| 6,897,390 B2 | 5/2005 | Caldwell et al. |
| 6,929,900 B2 | 8/2005 | Farquhar et al. |
| 6,930,672 B1 | 8/2005 | Kuribayashi |
| 6,940,291 B1 | 9/2005 | Ozick |
| 6,960,735 B2 | 11/2005 | Hein et al. |
| 6,962,436 B1 | 11/2005 | Holloway et al. |
| 6,964,023 B2 | 11/2005 | Maes et al. |
| 6,966,225 B1 | 11/2005 | Mallary |
| 6,967,587 B2 | 11/2005 | Snell et al. |
| 6,977,615 B2 | 12/2005 | Brandwein, Jr. |
| 6,987,605 B2 | 1/2006 | Liang et al. |
| 6,993,607 B2 | 1/2006 | Philipp |
| 6,999,066 B2 | 2/2006 | Litwiller |
| 7,030,513 B2 | 4/2006 | Caldwell |
| 7,046,129 B2 | 5/2006 | Regnet et al. |
| 7,053,360 B2 | 5/2006 | Balp et al. |
| 7,063,379 B2 | 6/2006 | Steuer et al. |
| 7,091,836 B2 | 8/2006 | Kachouh et al. |
| 7,091,886 B2 | 8/2006 | DePue et al. |
| 7,098,414 B2 | 8/2006 | Caldwell |
| 7,105,752 B2 | 9/2006 | Tsai et al. |
| 7,106,171 B1 | 9/2006 | Burgess |

(56) References Cited

U.S. PATENT DOCUMENTS

| | | |
|---|---|---|
| 7,135,995 B2 | 11/2006 | Engelmann et al. |
| 7,146,024 B2 | 12/2006 | Benkley, III |
| 7,151,450 B2 | 12/2006 | Beggs et al. |
| 7,151,532 B2 | 12/2006 | Schulz |
| 7,154,481 B2 | 12/2006 | Cross et al. |
| 7,180,017 B2 | 2/2007 | Hein |
| 7,186,936 B2 | 3/2007 | Marcus et al. |
| 7,205,777 B2 | 4/2007 | Schulz et al. |
| 7,215,529 B2 | 5/2007 | Rosenau |
| 7,218,498 B2 | 5/2007 | Caldwell |
| 7,232,973 B2 | 6/2007 | Kaps et al. |
| 7,242,393 B2 | 7/2007 | Caldwell |
| 7,245,131 B2 | 7/2007 | Kurachi et al. |
| 7,248,151 B2 | 7/2007 | McCall |
| 7,248,955 B2 | 7/2007 | Hein et al. |
| 7,254,775 B2 | 8/2007 | Geaghan et al. |
| 7,255,466 B2 | 8/2007 | Schmidt et al. |
| 7,255,622 B2 | 8/2007 | Stevenson et al. |
| 7,269,484 B2 | 9/2007 | Hein |
| 7,295,168 B2 | 11/2007 | Saegusa et al. |
| 7,295,904 B2 | 11/2007 | Kanevsky et al. |
| 7,339,579 B2 | 3/2008 | Richter et al. |
| 7,342,485 B2 | 3/2008 | Joehl et al. |
| 7,355,595 B2 | 4/2008 | Bathiche et al. |
| 7,361,860 B2 | 4/2008 | Caldwell |
| 7,385,308 B2 | 6/2008 | Yerdon et al. |
| 7,445,350 B2 | 11/2008 | Konet et al. |
| 7,479,788 B2 | 1/2009 | Bolender et al. |
| 7,489,053 B2 | 2/2009 | Gentile et al. |
| 7,521,941 B2 | 4/2009 | Ely et al. |
| 7,521,942 B2 | 4/2009 | Reynolds |
| 7,531,921 B2 | 5/2009 | Cencur |
| 7,532,202 B2 | 5/2009 | Roberts |
| 7,535,131 B1 | 5/2009 | Safieh, Jr. |
| 7,535,459 B2 | 5/2009 | You et al. |
| 7,567,240 B2 | 7/2009 | Peterson, Jr. et al. |
| 7,583,092 B2 | 9/2009 | Reynolds et al. |
| 7,643,010 B2 | 1/2010 | Westerman et al. |
| 7,653,883 B2 | 1/2010 | Hotelling et al. |
| 7,688,080 B2 | 3/2010 | Golovchenko et al. |
| 7,701,440 B2 | 4/2010 | Harley |
| 7,705,257 B2 | 4/2010 | Arione et al. |
| 7,708,120 B2 | 5/2010 | Einbinder |
| 7,714,846 B1 | 5/2010 | Gray |
| 7,719,142 B2 | 5/2010 | Hein et al. |
| 7,728,819 B2 | 6/2010 | Inokawa |
| 7,737,953 B2 | 6/2010 | Mackey |
| 7,737,956 B2 | 6/2010 | Hsieh et al. |
| 7,777,732 B2 | 8/2010 | Herz et al. |
| 7,782,307 B2 | 8/2010 | Westerman et al. |
| 7,791,594 B2 | 9/2010 | Dunko |
| 7,795,882 B2 | 9/2010 | Kirchner et al. |
| 7,800,590 B2 | 9/2010 | Satoh et al. |
| 7,821,425 B2 | 10/2010 | Philipp |
| 7,834,853 B2 | 11/2010 | Finney et al. |
| 7,839,392 B2 | 11/2010 | Pak et al. |
| 7,876,310 B2 | 1/2011 | Westerman et al. |
| 7,881,940 B2 | 2/2011 | Dusterhoff |
| RE42,199 E | 3/2011 | Caldwell |
| 7,898,531 B2 | 3/2011 | Bowden et al. |
| 7,920,131 B2 | 4/2011 | Westerman |
| 7,924,143 B2 | 4/2011 | Griffin et al. |
| 7,957,864 B2 | 6/2011 | Lenneman et al. |
| 7,977,596 B2 | 7/2011 | Born et al. |
| 7,978,181 B2 | 7/2011 | Westerman |
| 7,989,752 B2 | 8/2011 | Yokozawa |
| 8,026,904 B2 | 9/2011 | Westerman |
| 8,050,876 B2 | 11/2011 | Feen et al. |
| 8,054,296 B2 | 11/2011 | Land et al. |
| 8,054,300 B2 | 11/2011 | Bernstein |
| 8,077,154 B2 | 12/2011 | Emig et al. |
| 8,090,497 B2 | 1/2012 | Ando |
| 8,253,425 B2 | 8/2012 | Reynolds et al. |
| 8,283,800 B2 | 10/2012 | Salter et al. |
| 8,330,385 B2 | 12/2012 | Salter et al. |
| 8,339,286 B2 | 12/2012 | Cordeiro |
| 8,454,181 B2 | 6/2013 | Salter et al. |
| 8,508,487 B2 | 8/2013 | Schwesig et al. |
| 8,517,383 B2 | 8/2013 | Wallace et al. |
| 8,537,107 B1 | 9/2013 | Li |
| 8,575,949 B2 | 11/2013 | Salter et al. |
| 2001/0019228 A1 | 9/2001 | Gremm |
| 2001/0028558 A1 | 10/2001 | Rapp et al. |
| 2002/0040266 A1 | 4/2002 | Edgar et al. |
| 2002/0084721 A1 | 7/2002 | Walczak |
| 2002/0093786 A1 | 7/2002 | Maser |
| 2002/0149376 A1 | 10/2002 | Haffner et al. |
| 2002/0167439 A1 | 11/2002 | Bloch et al. |
| 2002/0167704 A1 | 11/2002 | Kleinhans et al. |
| 2003/0002273 A1 | 1/2003 | Anderson, Jr. et al. |
| 2003/0101781 A1 | 6/2003 | Budzynski et al. |
| 2003/0122554 A1 | 7/2003 | Karray et al. |
| 2003/0128116 A1 | 7/2003 | Ieda et al. |
| 2004/0056753 A1 | 3/2004 | Chiang et al. |
| 2004/0145613 A1 | 7/2004 | Stavely et al. |
| 2004/0160072 A1 | 8/2004 | Carter et al. |
| 2004/0160234 A1 | 8/2004 | Denen et al. |
| 2004/0160713 A1 | 8/2004 | Wei |
| 2004/0197547 A1 | 10/2004 | Bristow et al. |
| 2004/0246239 A1 | 12/2004 | Knowles et al. |
| 2005/0052429 A1 | 3/2005 | Philipp |
| 2005/0068712 A1 | 3/2005 | Schulz et al. |
| 2005/0088417 A1 | 4/2005 | Mulligan |
| 2005/0110769 A1 | 5/2005 | DaCosta et al. |
| 2005/0137765 A1 | 6/2005 | Hein et al. |
| 2005/0242923 A1 | 11/2005 | Pearson et al. |
| 2005/0275567 A1 | 12/2005 | DePue et al. |
| 2006/0022682 A1 | 2/2006 | Nakamura et al. |
| 2006/0038793 A1 | 2/2006 | Philipp |
| 2006/0044800 A1 | 3/2006 | Reime |
| 2006/0082545 A1 | 4/2006 | Choquet et al. |
| 2006/0170241 A1 | 8/2006 | Yamashita |
| 2006/0244733 A1 | 11/2006 | Geaghan |
| 2006/0262549 A1 | 11/2006 | Schmidt et al. |
| 2006/0267953 A1 | 11/2006 | Peterson, Jr. et al. |
| 2006/0279015 A1 | 12/2006 | Wang |
| 2006/0287474 A1 | 12/2006 | Crawford et al. |
| 2007/0008726 A1 | 1/2007 | Brown |
| 2007/0023265 A1 | 2/2007 | Ishikawa et al. |
| 2007/0051609 A1 | 3/2007 | Parkinson |
| 2007/0068790 A1 | 3/2007 | Yerdon et al. |
| 2007/0096565 A1 | 5/2007 | Breed et al. |
| 2007/0103431 A1 | 5/2007 | Tabatowski-Bush |
| 2007/0226994 A1 | 10/2007 | Wollach et al. |
| 2007/0232779 A1 | 10/2007 | Moody et al. |
| 2007/0247429 A1 | 10/2007 | Westerman |
| 2007/0255468 A1 | 11/2007 | Strebel et al. |
| 2007/0257891 A1 | 11/2007 | Esenther et al. |
| 2007/0296709 A1 | 12/2007 | GuangHai |
| 2008/0012835 A1 | 1/2008 | Rimon et al. |
| 2008/0018604 A1 | 1/2008 | Paun et al. |
| 2008/0023715 A1 | 1/2008 | Choi |
| 2008/0030465 A1 | 2/2008 | Konet et al. |
| 2008/0074398 A1 | 3/2008 | Wright |
| 2008/0111714 A1 | 5/2008 | Kremin |
| 2008/0136792 A1 | 6/2008 | Peng et al. |
| 2008/0142352 A1 | 6/2008 | Wright |
| 2008/0143681 A1 | 6/2008 | XiaoPing |
| 2008/0150905 A1 | 6/2008 | Grivna et al. |
| 2008/0158146 A1 | 7/2008 | Westerman |
| 2008/0196945 A1 | 8/2008 | Konstas |
| 2008/0202912 A1 | 8/2008 | Boddie et al. |
| 2008/0231290 A1 | 9/2008 | Zhitomirsky |
| 2008/0238650 A1 | 10/2008 | Riihimaki et al. |
| 2008/0257706 A1 | 10/2008 | Haag |
| 2008/0272623 A1 | 11/2008 | Kadzban et al. |
| 2009/0066659 A1 | 3/2009 | He et al. |
| 2009/0079699 A1 | 3/2009 | Sun |
| 2009/0108985 A1 | 4/2009 | Haag et al. |
| 2009/0115731 A1 | 5/2009 | Rak |
| 2009/0120697 A1 | 5/2009 | Wilner et al. |
| 2009/0135157 A1 | 5/2009 | Harley |
| 2009/0225043 A1 | 9/2009 | Rosener |
| 2009/0235588 A1 | 9/2009 | Patterson et al. |

(56) References Cited

U.S. PATENT DOCUMENTS

| | | |
|---|---|---|
| 2009/0236210 A1 | 9/2009 | Clark et al. |
| 2009/0251435 A1 | 10/2009 | Westerman et al. |
| 2009/0256677 A1 | 10/2009 | Hein et al. |
| 2009/0309616 A1 | 12/2009 | Klinghult et al. |
| 2010/0001974 A1 | 1/2010 | Su et al. |
| 2010/0007613 A1 | 1/2010 | Costa |
| 2010/0007620 A1 | 1/2010 | Hsieh et al. |
| 2010/0013777 A1 | 1/2010 | Baudisch et al. |
| 2010/0026654 A1 | 2/2010 | Suddreth |
| 2010/0039392 A1 | 2/2010 | Pratt et al. |
| 2010/0090712 A1 | 4/2010 | Vandermeijden |
| 2010/0090966 A1 | 4/2010 | Gregorio |
| 2010/0102830 A1 | 4/2010 | Curtis et al. |
| 2010/0103139 A1 | 4/2010 | Soo et al. |
| 2010/0110037 A1 | 5/2010 | Huang et al. |
| 2010/0125393 A1 | 5/2010 | Jarvinen et al. |
| 2010/0156814 A1 | 6/2010 | Weber et al. |
| 2010/0177057 A1 | 7/2010 | Flint et al. |
| 2010/0188356 A1 | 7/2010 | Vu et al. |
| 2010/0188364 A1 | 7/2010 | Lin et al. |
| 2010/0194692 A1 | 8/2010 | Orr et al. |
| 2010/0207907 A1 | 8/2010 | Tanabe et al. |
| 2010/0212819 A1 | 8/2010 | Salter et al. |
| 2010/0214253 A1 | 8/2010 | Wu et al. |
| 2010/0219935 A1 | 9/2010 | Bingle et al. |
| 2010/0241431 A1 | 9/2010 | Weng et al. |
| 2010/0241983 A1 | 9/2010 | Walline et al. |
| 2010/0245286 A1 | 9/2010 | Parker |
| 2010/0250071 A1 | 9/2010 | Pala et al. |
| 2010/0277431 A1 | 11/2010 | Klinghult |
| 2010/0280983 A1 | 11/2010 | Cho et al. |
| 2010/0286867 A1 | 11/2010 | Bergholz et al. |
| 2010/0289754 A1 | 11/2010 | Sleeman et al. |
| 2010/0289759 A1 | 11/2010 | Fisher et al. |
| 2010/0296303 A1 | 11/2010 | Sarioglu et al. |
| 2010/0302200 A1 | 12/2010 | Netherton et al. |
| 2010/0315267 A1 | 12/2010 | Chung et al. |
| 2010/0321214 A1 | 12/2010 | Wang et al. |
| 2010/0321321 A1 | 12/2010 | Shenfield et al. |
| 2010/0321335 A1 | 12/2010 | Lim et al. |
| 2010/0328261 A1 | 12/2010 | Woolley et al. |
| 2010/0328262 A1 | 12/2010 | Huang et al. |
| 2011/0001707 A1 | 1/2011 | Faubert et al. |
| 2011/0001722 A1 | 1/2011 | Newman et al. |
| 2011/0007021 A1 | 1/2011 | Bernstein et al. |
| 2011/0007023 A1 | 1/2011 | Abrahamsson et al. |
| 2011/0012623 A1 | 1/2011 | Gastel et al. |
| 2011/0018744 A1 | 1/2011 | Philipp |
| 2011/0018817 A1 | 1/2011 | Kryze et al. |
| 2011/0022393 A1 | 1/2011 | Waller et al. |
| 2011/0031983 A1 | 2/2011 | David et al. |
| 2011/0034219 A1 | 2/2011 | Filson et al. |
| 2011/0037725 A1 | 2/2011 | Pryor |
| 2011/0037735 A1 | 2/2011 | Land et al. |
| 2011/0039602 A1 | 2/2011 | McNamara et al. |
| 2011/0041409 A1 | 2/2011 | Newman et al. |
| 2011/0043481 A1 | 2/2011 | Bruwer |
| 2011/0050251 A1 | 3/2011 | Franke et al. |
| 2011/0050587 A1 | 3/2011 | Natanzon et al. |
| 2011/0050618 A1 | 3/2011 | Murphy et al. |
| 2011/0050620 A1 | 3/2011 | Hristov |
| 2011/0055753 A1 | 3/2011 | Horodezky et al. |
| 2011/0062969 A1 | 3/2011 | Hargreaves et al. |
| 2011/0063425 A1 | 3/2011 | Tieman |
| 2011/0074573 A1 | 3/2011 | Seshadri |
| 2011/0080365 A1 | 4/2011 | Westerman |
| 2011/0080366 A1 | 4/2011 | Bolender |
| 2011/0080376 A1 | 4/2011 | Kuo et al. |
| 2011/0082616 A1 | 4/2011 | Small et al. |
| 2011/0083110 A1 | 4/2011 | Griffin et al. |
| 2011/0095997 A1 | 4/2011 | Philipp |
| 2011/0115732 A1 | 5/2011 | Coni et al. |
| 2011/0115742 A1 | 5/2011 | Sobel et al. |
| 2011/0134047 A1 | 6/2011 | Wigdor et al. |
| 2011/0134054 A1 | 6/2011 | Woo et al. |
| 2011/0141006 A1 | 6/2011 | Rabu |
| 2011/0141041 A1 | 6/2011 | Parkinson et al. |
| 2011/0148803 A1 | 6/2011 | Xu |
| 2011/0157037 A1 | 6/2011 | Shamir et al. |
| 2011/0157079 A1 | 6/2011 | Wu et al. |
| 2011/0157080 A1 | 6/2011 | Ciesla et al. |
| 2011/0157089 A1 | 6/2011 | Rainisto |
| 2011/0161001 A1 | 6/2011 | Fink |
| 2011/0169758 A1 | 7/2011 | Aono |
| 2011/0187492 A1 | 8/2011 | Newman et al. |
| 2011/0279276 A1 | 11/2011 | Newham |
| 2011/0279409 A1 | 11/2011 | Salaverry et al. |
| 2012/0007821 A1 | 1/2012 | Zaliva |
| 2012/0037485 A1 | 2/2012 | Sitarski |
| 2012/0043976 A1 | 2/2012 | Bokma et al. |
| 2012/0055557 A1 | 3/2012 | Belz et al. |
| 2012/0062247 A1 | 3/2012 | Chang |
| 2012/0062498 A1 | 3/2012 | Weaver et al. |
| 2012/0068956 A1 | 3/2012 | Jira et al. |
| 2012/0154324 A1 | 6/2012 | Wright et al. |
| 2012/0217147 A1 | 8/2012 | Porter et al. |
| 2012/0312676 A1 | 12/2012 | Salter et al. |
| 2012/0313648 A1 | 12/2012 | Salter et al. |
| 2013/0036529 A1 | 2/2013 | Salter et al. |
| 2013/0076121 A1 | 3/2013 | Salter et al. |
| 2013/0093500 A1 | 4/2013 | Bruwer |
| 2013/0106436 A1 | 5/2013 | Brunet et al. |
| 2013/0113397 A1 | 5/2013 | Salter et al. |
| 2013/0113544 A1 | 5/2013 | Salter et al. |
| 2013/0126325 A1 | 5/2013 | Curtis et al. |
| 2013/0270896 A1 | 10/2013 | Buttolo et al. |
| 2013/0270899 A1 | 10/2013 | Buttolo et al. |
| 2013/0271157 A1 | 10/2013 | Buttolo et al. |
| 2013/0271159 A1 | 10/2013 | Santos et al. |
| 2013/0271182 A1 | 10/2013 | Buttolo et al. |
| 2013/0271202 A1 | 10/2013 | Buttolo et al. |
| 2013/0271203 A1 | 10/2013 | Salter et al. |
| 2013/0271204 A1 | 10/2013 | Salter et al. |
| 2013/0291439 A1 | 11/2013 | Wuerstlein et al. |
| 2013/0307610 A1 | 11/2013 | Salter et al. |
| 2013/0328616 A1 | 12/2013 | Buttolo et al. |
| 2014/0002405 A1 | 1/2014 | Salter et al. |
| 2014/0145733 A1 | 5/2014 | Buttolo et al. |

FOREIGN PATENT DOCUMENTS

| | | |
|---|---|---|
| EP | 1327860 | 7/2003 |
| EP | 1562293 | 8/2005 |
| EP | 2133777 | 10/2011 |
| EP | 2133777 B1 | 10/2011 |
| GB | 2071338 | 9/1981 |
| GB | 2158737 | 11/1985 |
| GB | 2279750 | 1/1995 |
| GB | 2409578 | 6/2005 |
| GB | 2418741 | 4/2006 |
| JP | 61188515 | 8/1986 |
| JP | 4065038 | 3/1992 |
| JP | 04082416 | 3/1992 |
| JP | 07315880 | 12/1995 |
| JP | 08138446 | 5/1996 |
| JP | 11065764 | 3/1999 |
| JP | 11110131 | 4/1999 |
| JP | 11260133 | 9/1999 |
| JP | 11316553 | 11/1999 |
| JP | 2000047178 | 2/2000 |
| JP | 2000075293 | 3/2000 |
| JP | 2001013868 | 1/2001 |
| JP | 2006007764 | 1/2006 |
| JP | 2007027034 | 2/2007 |
| JP | 2008033701 | 2/2008 |
| JP | 2010139362 | 6/2010 |
| JP | 2010165618 | 7/2010 |
| JP | 2010218422 | 9/2010 |
| JP | 2010239587 | 10/2010 |
| JP | 2010287148 | 12/2010 |
| JP | 2011014280 | 1/2011 |
| KR | 20040110463 | 12/2004 |
| KR | 20090127544 | 12/2009 |
| KR | 20100114768 | 10/2010 |

(56) References Cited

FOREIGN PATENT DOCUMENTS

| WO | 9636960 | 11/1996 |
|---|---|---|
| WO | 9963394 | 12/1999 |
| WO | 2006093398 | 9/2006 |
| WO | 2007022027 | 2/2007 |
| WO | 2008121760 | 10/2008 |
| WO | 2009054592 | 4/2009 |
| WO | 2010111362 | 9/2010 |
| WO | 2012032318 | 3/2012 |
| WO | 2012032318 A1 | 3/2012 |
| WO | 2012169106 | 12/2012 |
| WO | 2012169106 A1 | 12/2012 |

OTHER PUBLICATIONS

U.S. Appl. No. 13/665,253, filed Oct. 31, 2012, entitled Proximity Switch Assembly Having Round Layer, (15 pages of specification and 7 pages of drawings) and Official Filing Receipt (3 pages).

U.S. Appl. No. 13/799,413, filed Mar. 13, 2013, entitled "Proximity Interface Development System Having Replicator and Method," (29 pages of specification and 20 pages of drawings) and Official Filing Receipt (3 pages).

U.S. Appl. No. 13/799,478, filed Mar. 13, 2013, entitled "Proximity Interface Development System Having Analyzer and Method," (29 pages of specification and 20 pages of drawings) and Official Filing Receipt (3 pages).

U.S. Appl. No. 14/168,614, filed Jan. 30, 2014, entitled "Proximity Switch Assembly and Activation Method Having Virtual Button Mode," (30 pages of specification and 15 pages of drawings) and Official Filing Receipt (3 pages).

Van Ess, Dave et al., "Capacitive Touch Switches for Automotive Applications," 7 pages, Published in Automotive DesignLine, www.automotiedesignline.com, Feb. 2006.

"Introduction to Touch Solutions, White Paper, Revision 1.0 A," Densitron Corporation, 14 pages, Aug. 21, 2007.

Kliffken, Marksu G. et al., "Obstacle Detection for Power Operated Window-Lift and Sunroof Actuation Systems," Paper No. 2001-1-0466, 1 page, © 2011 SAE International, Published Mar. 5, 2001.

NXP Capacitive Sensors, 1 page, www.nxp.com, copyrighted 2006-2010, NXP Semiconductors.

"Moisture Immunity in QuickSense Studio," AN552, Rev. 0.1 10/10, 8 pages, Silicon Laboratories, Inc., © 2010.

"Clevios P Formulation Guide," 12 pages, www.clevios.com, Heraeus Clevios GmbH, no date provided.

"Charge-Transfer Sensing-Based Touch Controls Facilitate Creative Interfaces," www.ferret.com.au, 2 pages, Jan. 18, 2006.

Kiosk Peripherals, "Touch Screen," www.bitsbytesintegrators.com/kiosk-peripherals.html, 10 pages, no date provided.

JVC KD-AVX777 Detachable Front-Panel with Integrated 5.4" Touch-Screen Monitor, 6 pages, www.crutchfield.com, no date provided.

Ergonomic Palm Buttons, Pepperl+Fuchs, www.wolfautomation.com, 6 pages, no date provided.

"Orgacon EL-P3000, Screen printing Ink Series 3000," 2 pages, AGFA, last updated in Feb. 2006.

"Touch Sensors Design Guide" by Atmel, 10620 D-AT42-04/09, Revised Apr. 2009, 72 pages, Copyrighted 2008-2009 Atmel Corporation.

U.S. Appl. No. 14/314,328, filed Jun. 25, 2014, entitled "Proximity Switch Assembly Having Pliable Surface and Depression," (43 pages of specification and 24 pages of drawings) and Official Filing Receipt (3 pages).

U.S. Appl. No. 14/314,364, filed Jun. 25, 2014, entitled "Proximity Switch Assembly Having Groove Between Adjacent Proximity Sensors," (43 pages of specification and 24 pages of drawings) and Official Filing Receipt (3 pages).

PROXIMITY SWITCH ASSEMBLY HAVING NON-SWITCH CONTACT AND METHOD

FIELD OF THE INVENTION

The present invention generally relates to switches, and more particularly relates to proximity switches having enhanced determination of switch activation.

BACKGROUND OF THE INVENTION

Automotive vehicles are typically equipped with various user actuatable switches, such as switches for operating devices including powered windows, door locks, headlights, windshield wipers, moonroofs or sunroofs, interior lighting, radio and infotainment devices, and various other devices. Generally, these types of switches need to be actuated by a user in order to activate or deactivate a device or perform some type of control function. Proximity switches, such as capacitive switches, employ one or more proximity sensors to generate a sense activation field and sense changes to the activation field indicative of user actuation of the switch, typically caused by a user's finger in close proximity or contact with the sensor. Capacitive switches are typically configured to detect user actuation of the switch based on comparison of the sense activation field to a threshold.

Switch assemblies often employ a plurality of capacitive switches in close proximity to one another and generally require that a user select a single desired capacitive switch to perform the intended operation. In some applications, such as use in an automobile, the driver of the vehicle has limited ability to view the switches due to driver distraction. In such applications, it is desirable to allow the user to explore the switch assembly for a specific button while avoiding a premature determination of switch activation. Thus, it is desirable to discriminate whether the user intends to activate a switch, or is simply exploring for a specific switch button while focusing on a higher priority task, such as driving, or has no intent to activate a switch. Accordingly, it is desirable to provide for a proximity switch arrangement which enhances the use of proximity switches by a person, such as a driver of a vehicle.

SUMMARY OF THE INVENTION

According to one aspect of the present invention, a proximity switch assembly is provided. The proximity switch assembly includes a first proximity switch having a first proximity sensor and a second proximity switch having a second proximity sensor. The proximity switch assembly also includes a tactile feature disposed between the first and second proximity switches. The proximity switch assembly further includes control circuitry detecting an object on the tactile feature based on sensed signals from the first and second proximity sensors and preventing activation of the first and second switches when an object is detected on the tactile feature.

According to another aspect of the present invention, a proximity switch assembly is provided that includes a first proximity switch having a first sensor. The proximity switch assembly also includes a resting pad having a second sensor for sensing an object on the resting pad. The proximity switch assembly further includes control circuitry detecting a first object with the first proximity sensor and a second object on the resting pad and determining activation of the first proximity switch based on detection of the first and second objects.

According to a further aspect of the present invention, a method of controlling activation of proximity switches is provided. The method includes the steps of sensing a first signal associated with a first sensor for a first proximity switch and sensing a second signal associated with a second sensor for a second proximity switch. The method also includes the step of detecting an object on a tactile feature disposed between the first and second proximity switches based on the first and second signals. The method further includes the step of controlling activation of the first and second switches based on the detected object.

These and other aspects, objects, and features of the present invention will be understood and appreciated by those skilled in the art upon studying the following specification, claims, and appended drawings.

DETAILED DESCRIPTION OF THE PREFERRED EMBODIMENTS

As required, detailed embodiments of the present invention are disclosed herein; however, it is to be understood that the disclosed embodiments are merely exemplary of the invention that may be embodied in various and alternative forms. The figures are not necessarily to a detailed design; some schematics may be exaggerated or minimized to show function overview. Therefore, specific structural and functional details disclosed herein are not to be interpreted as limiting, but merely as a representative basis for teaching one skilled in the art to variously employ the present invention.

Figure 1:
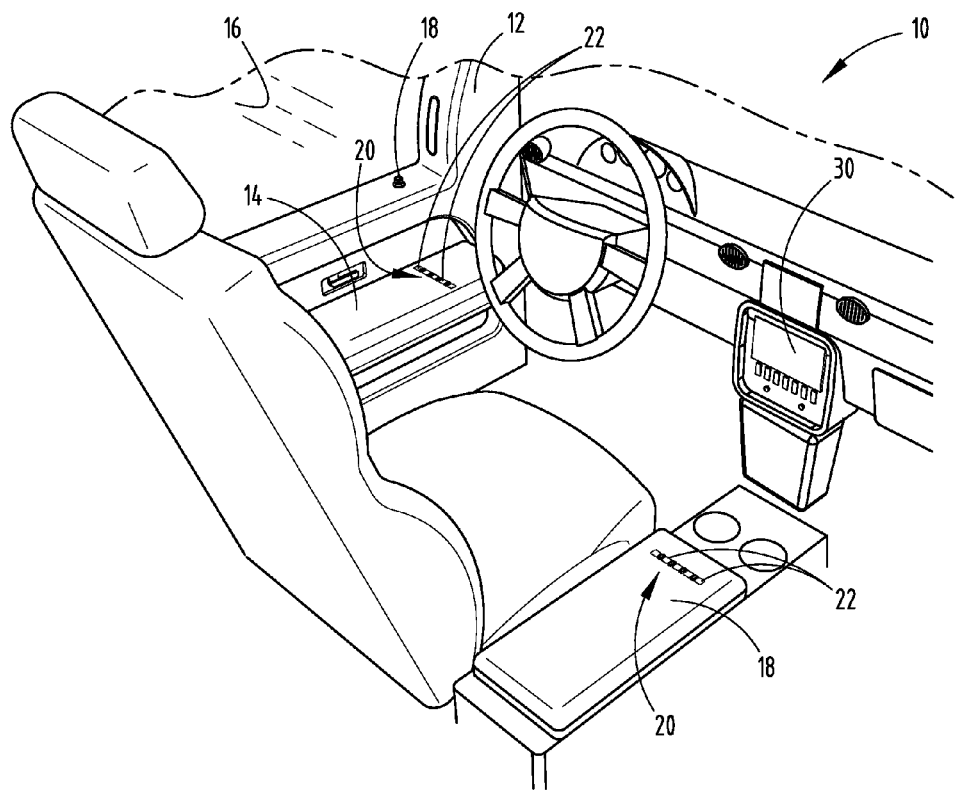
FIG. 1 is a perspective view of a passenger compartment of an automotive vehicle having proximity switch assemblies in a door armrest and center console, according to one embodiment.

Referring to FIG. 1, the interior of an automotive vehicle 10 is generally illustrated having a passenger compartment and switch assemblies 20 employing a plurality of proximity switches 22 having switch activation monitoring and determination, according to one embodiment. The vehicle 10 is shown having a door 12 and a center console 18, both including a proximity switch assembly 20. The door 12 includes an armrest 14 with a proximity switch assembly 20 provided thereon to allow a passenger (e.g., driver) to control devices or functions, such as opening and closing of window 16 and door locks 18. The switch assembly 20 located in the center console 18 may likewise control devices or function, such as the window 16 and door locks 14 and may control various other designated vehicle functions. The proximity switches 22 may control any of a number of vehicle devices and functions, such as controlling movement of a door window 16, door locks 18, a sunroof or moonroof, controlling movement of a moonroof shade, controlling activation of one or more lighting devices such as interior map/reading and dome lights, and various other devices and functions. However, it should be appreciated that the proximity switches 22 may be located elsewhere on the vehicle 10, such as in the dash panel, on other consoles such as an overhead console, on the steering wheel, integrated into a touch screen display 30 for a radio or infotainment system such as a navigation and/or audio display, or located elsewhere onboard the vehicle 10 according to various vehicle applications.

The proximity switches 22 are shown and described herein as capacitive switches, according to one embodiment. Each proximity switch 22 includes at least one proximity sensor that provides a sense activation field to sense contact or close proximity (e.g., within one millimeter) of a first object such as a user's finger in relation to the one or more proximity sensors, such as a swiping motion by the user's finger. Thus, the sense activation field of each proximity switch 22 is a capacitive field in the exemplary embodiment and the user's finger has electrical conductivity and dielectric properties that cause a change or disturbance in the sense activation field as should be evident to those skilled in the art. However, it should also be appreciated by those skilled in the art that additional or alternative types of proximity sensors can be used, such as, but not limited to, inductive sensors, optical sensors, temperatures sensors, resistive sensors, the like, or a combination thereof. Exemplary proximity sensors are described in the Apr. 9, 2009, ATMEL® Touch Sensors Design Guide, 10620 D-AT42-04/09, the entire reference hereby being incorporated herein by reference.

The proximity switches 22 shown in FIG. 1 each provide control of a vehicle component or device or provide a designated control function. One or more of the proximity switches 22 may be dedicated to controlling movement of a door window 16 so as to cause the window 16 to move in an open or closed direction. One or more other proximity switches 22 may be dedicated to controlling door locks 18 between unlocked and locked positions. Each of the window 16 and door locks 18 may be actuated by an electric motor in response to actuation of the corresponding proximity switch 22. Other proximity switches 22 may be dedicated to controlling other devices, such as turning an interior map/reading light on, turning an interior map/reading light off, turning a dome lamp on or off, unlocking a trunk, opening a rear hatch, or defeating a door light switch. Various other vehicle controls may be controlled by way of the proximity switches 22 described herein.

Figure 2:
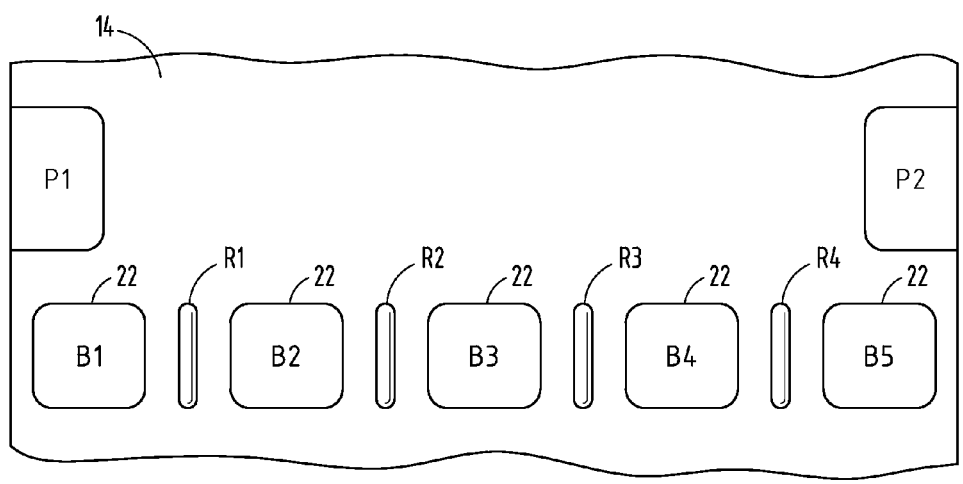
FIG. 2 is an enlarged view of one of the proximity switch assemblies shown in FIG. 1, according to a first embodiment.

Referring to FIG. 2, a proximity switch assembly 20 is shown according to a first embodiment having a linear array of five proximity switches 22, four ridges R1-R4 and two resting pads P1 and P2. The proximity switches 22 are described and shown as virtual buttons labeled B1-B5, each having a geometry and area corresponding to a separate proximity switch 22. The proximity switch assembly 20 also includes a plurality of outward extending members shown as ridges, labeled R1-R4, each of which serves as a tactile feature disposed between adjacent pairs of proximity switches 22. Ridge R1 is located between buttons B1 and B2, ridge R2 is located between buttons B2 and B3, ridge R3 is located between buttons B3 and B4, and ridge R4 is located between buttons B4 and B5. Each of ridges R1-R4 has an elevational change that extends outward relative to the contact surface of the capacitive switches 22. The capacitive switches may be co-planar with the surrounding surface area. The ridges R1-R4 provide tactile features that a user may feel to help identify the position of their finger relative to the proximity switches 22. A user may rest an object such as one or more fingers on a ridge, particularly when no switch activation is desired. The user may slide one or more fingers across the surface on or above the switch assembly 20 on top of ridges R1-R4 while in the hunting or exploration mode.

The proximity switch assembly 20 is shown including a pair of resting pads labeled P1 and P2 shown located generally above buttons B1 and B5, respectively. The resting pads P1 and P2 may include active sensors, according to one embodiment. The active sensors of resting pads P1 and P2 may be proximity sensors, such as capacitive sensors, similar to those employed in proximity switches 22. The resting pads P1 and P2 have a geometry and dedicated location configured to serve as resting pads upon which a user may place a thumb, finger, palm or other body part onto one of the resting pads P1 or P2 to either activate one of the proximity switches 22 or to prevent activation of one of the proximity switches 22.

Figure 3:
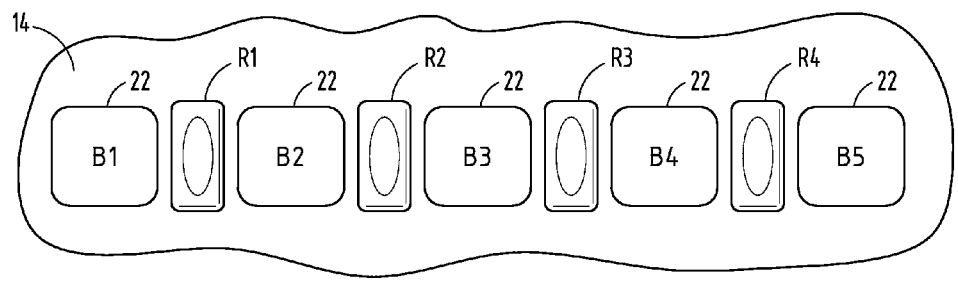
FIG. 3 is an enlarged view of a proximity switch assembly, according to a second embodiment.

Referring to FIG. 3, a proximity switch assembly 20 is shown according to a second embodiment. In this embodiment, a linear array of five proximity switches 22 shown also identified as virtual buttons B1-B5 is provided with a plurality of ridges R1-R4 interposed between adjacent neighboring switches 22. Ridges R1-R4 are provided between adjacent buttons as described above in connection with the embodiment shown in FIG. 2. In this embodiment, each of ridges R1-R4 has a wider upstanding member which serves as a tactile feature between adjacent neighboring proximity switches 22 and each ridge R1-R4 further has a depression, such as an oval-shaped depression, provided on the top surface thereof to give a feel for a user. In this embodiment, ridges R1-R4 are wider than the first embodiment such that a user may rest a finger, thumb, or other body part on the ridge to serve as a resting pad. If a hand, finger, other body part or object is detected on a ridge, the proximity switches 22 adjacent to that ridge are prevented from activation. It should be appreciated that detection of an object on a ridge may be sensed by sensing the activation fields associated with the adjacent neighboring proximity switches 22, according to one embodiment.

Figure 4:
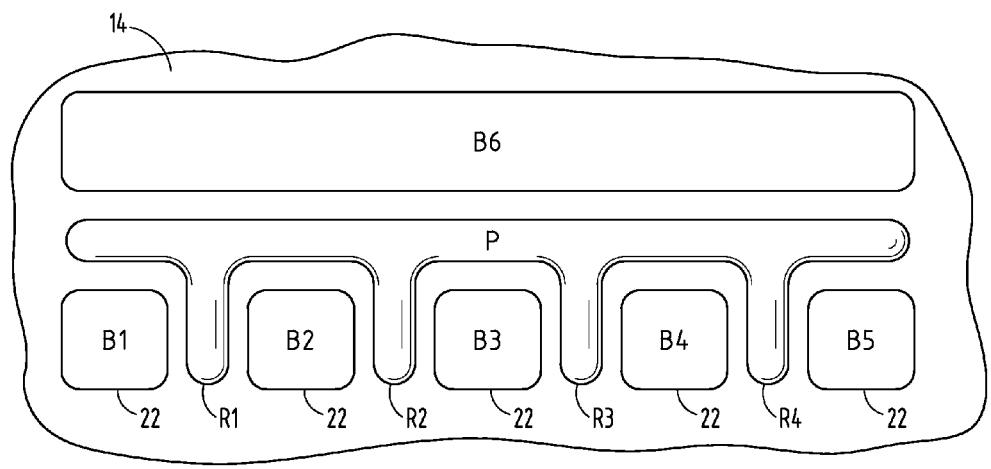
FIG. 4 is an enlarged view of a proximity switch assembly, according to a third embodiment.

Referring to FIG. 4, a proximity switch assembly 20 is illustrated having a linear array of proximity switches 22 shown also identified as virtual buttons B1-B5 and a further proximity shown as sensor B6 separated therefrom via a resting pad P, according to a third embodiment. In this embodiment, a single upstanding member is provided as pad P having a plurality of fingers which serve as tactile features in the form of ridges R1-R4 extending between adjacent neighboring proximity switches 22. The pad P also extends horizontally above the linear array of proximity switches 22 to isolate switches 22 from sensor B6. Proximity sensor B6 is an active sensor that may be configured as a capacitive sensor similar to those employed in proximity switches 22. According to this embodiment, an object is detected on one of the ridges R1-R4 by comparing the activation signal associated with adjacent neighboring proximity switches 22, such that if a sufficient signal is detected in both adjacent switches 22, then an object is determined to be detected on the ridge therebetween. The comparison of signals between each adjacent proximity switches 22 is processed to determine whether a finger or other object is located on one of the ridges. If a finger is located on one of the ridges, then activation of one of the adjacent proximity switches 22 immediately on either side of that ridge is prevented. Additionally, the activation field associated with sensor B6 relative to each of the proximity switches shown as buttons B1-B5 is processed. By processing the signals associated with each of buttons B1-B5 relative to sensor B6, a determination can be made as to whether or not an object is resting on the resting pad P provided therebetween. If an object is sensed on the resting pad P, then activation of one of the proximity switches is allowed to occur, according to one embodiment. Thus, the proximity switch assembly 20 requires that a user rest a portion of their hand or other object on the resting pad P prior to activating one of the switches in order to perform the intended operation. According to another embodiment, activation of the proximity switches may be prevented when an object is detected on the resting pad.

While the tactile feature shown and described herein includes a plurality of outward extending members in the form of ridges, it should be appreciated that other tactile features having various shapes, sizes and surface textures may be employed. According to various embodiments, the tactile feature may be a surface roughening, a different material, or other feature.

Figure 5:
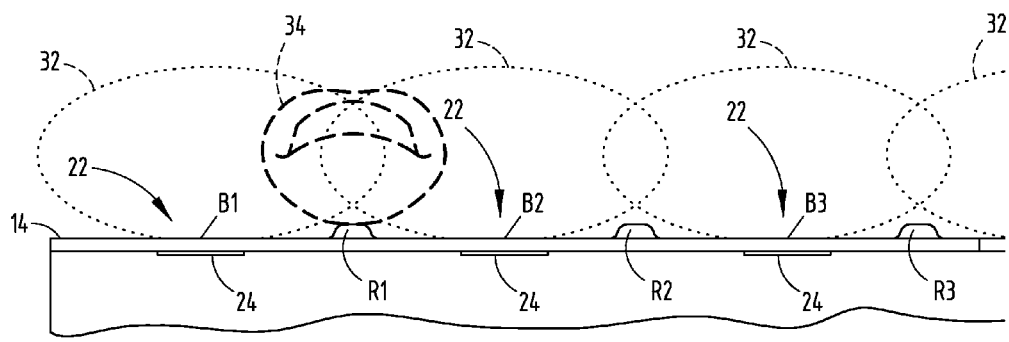
FIG. 5 is an enlarged cross-sectional view taken through line V-V in FIG. 3 showing an array of proximity switches in relation to a user's finger.

Referring to FIG. 5, a portion of the proximity switch assembly 20 shown in FIG. 2 is illustrated having an array of three serially arranged proximity switches 22 in close relation to one another in relation to a user's finger 34 during use of the switch assembly 20. Each proximity switch 22 includes one or more proximity sensors 24 for generating a sense activation field 32. The proximity sensors 24 may be formed on a substrate such as a rear surface of a polymeric door armrest or console which is opposite the top side contact surface. The contact side of the switch assembly 20 has a generally flush surface, with the exception of the tactile features which are shown as outward extending members in the shape of ridges R1 and R2 between adjacent neighboring proximity switches 22. In addition, a light may be further disposed on the rear side of substrate 14 to light each button B1-B5. It should be appreciated that the proximity switches 22 and ridges R1-R5 shown in FIGS. 3 and 4 may be formed similar to those shown in FIGS. 2 and 5.

Figure 6:
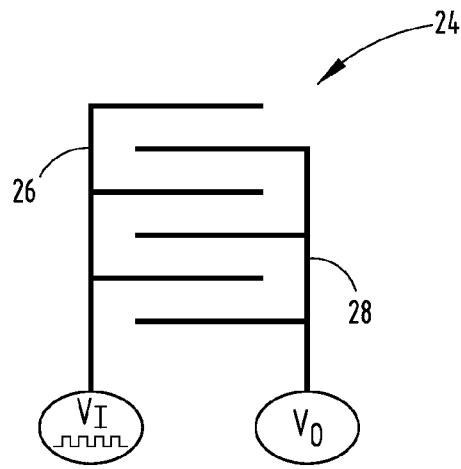
FIG. 6 is a schematic diagram of a capacitive sensor employed in each of the capacitive switches shown in FIG. 5.

According to one embodiment, each of the proximity sensors 24 may be formed by printing conductive ink onto the rear surface of the substrate 14 which may be the armrest 14. One example of a printed ink proximity sensor 24 is shown in FIG. 6 generally having a drive electrode 26 and a receive electrode 28 each having interdigitated fingers for generating a capacitive field 32. It should be appreciated that each of the proximity sensors 24 may be otherwise formed such as by assembling a preformed conductive circuit trace onto a substrate according to other embodiments. The drive electrode 26 receives square wave drive pulses applied at voltage $V_I$. The receive electrode 28 has an output for generating an output voltage $V_O$. It should be appreciated that the electrodes 26 and 28 may be arranged in various other configurations for generating the capacitive field as the activation field 32.

In the embodiment shown and described herein, the drive electrode 26 of each proximity sensor 24 is applied with voltage input $V_I$ as square wave pulses having a charge pulse cycle sufficient to charge the receive electrode 28 to a desired voltage. The receive electrode 28 thereby serves as a measurement electrode. In the embodiment shown, adjacent sense activation fields 32 generated by adjacent proximity switches 22 overlap, however, more or less overlap may exist according to other embodiments. When a user or operator, such as the user's finger 34, enters an activation field 32, the proximity switch assembly 20 detects the disturbance caused by the finger 34 to the activation field 32 and determines whether the disturbance is sufficient to activate the corresponding proximity switch 22. The disturbance of the activation field 32 is detected by processing the charge pulse signal associated with the corresponding signal channel. When the user's finger 34 contacts two activation fields 32, the proximity switch assembly 20 detects the disturbance of both contacted activation fields 32 via separate signal channels. Each proximity switch 22 has its own dedicated signal channel generating charge pulse counts which is processed as discussed herein.

Figure 7:
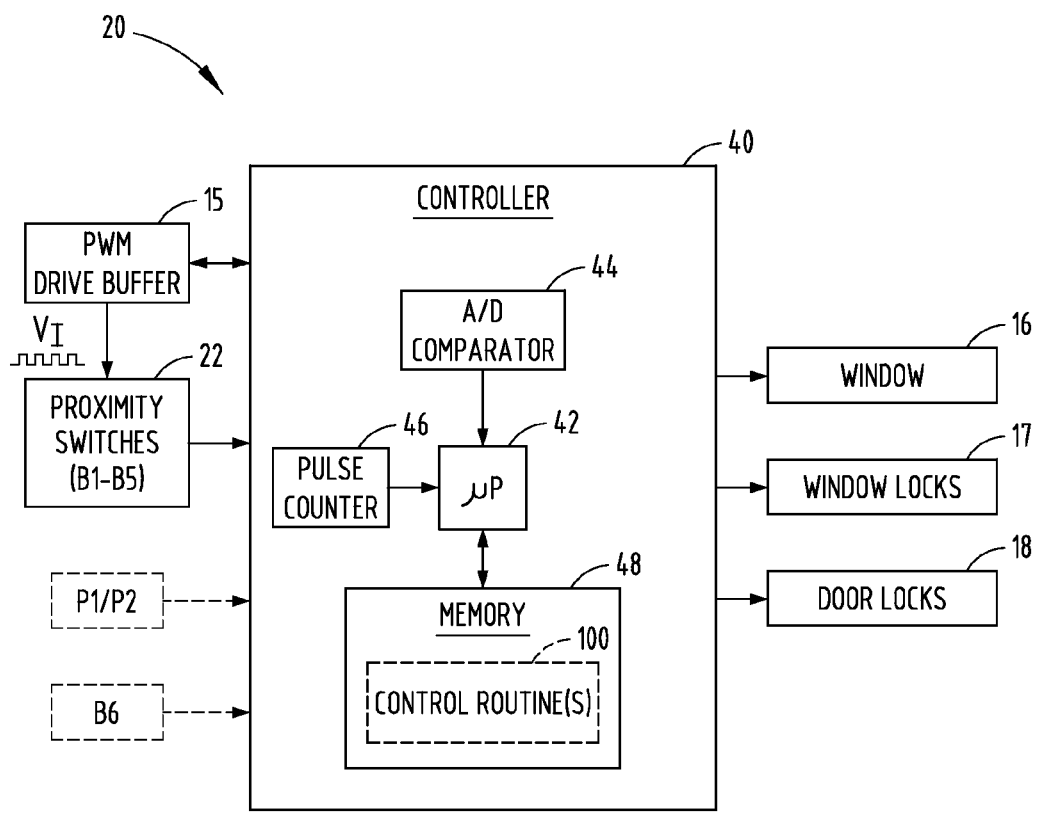
FIG. 7 is a block diagram illustrating the proximity switch assembly, according to one embodiment.

Referring to FIG. 7, the proximity switch assembly 20 is illustrated according to one embodiment. A plurality of proximity switches 22 are shown providing inputs to a controller 40, such as a microcontroller. The controller 40 may include control circuitry, such as a microprocessor 42 and memory 48. The control circuitry may include sense control circuitry processing the activation field signal associated with each switch 22 to sense user activation of a switch by comparing the activation field signal to one or more thresholds pursuant to one or more control routines. It should be appreciated that other analog and/or digital control circuitry may be employed to process each activation field signal, determine user activation, and initiate an action. The controller 40 may employ a QMatrix acquisition method available by ATMEL®, according to one embodiment. The ATMEL acquisition method employs a WINDOWS® host C/C++ compiler and debugger WinAVR to simplify development and testing the utility Hawkeye that allows monitoring in real-time the internal state of critical variables in the software as well as collecting logs of data for post-processing.

The controller 40 provides an output signal to one or more devices that are configured to perform dedicated actions responsive to detected activation of a proximity switch. For example, the one or more devices may include door windows 16 having a motor to move the window panel between open and closed positions, door locks 18 having a motor or other actuator to move the door lock between locked and unlocked positions, and a window lock 17 that may be used to lock all vehicle doors, such as for parental control of windows. Other devices may be controlled such as a radio for performing on and off functions, volume control, scanning, and other types of devices for performing other dedicated functions. One of the proximity switches 22 may be dedicated to actuating the door window closed, another proximity switch 22 may be dedicated to actuating the door window open, and a further switch 22 may be dedicated to actuating the door locks unlocked, a further switch 22 may be dedicated to actuate the door locks locked, and a further switch 22 may be actuated to lock all vehicle windows.

The controller 40 is further shown having an analog to digital (A/D) comparator 44 coupled to the microprocessor 42. The A/D comparator 44 receives the voltage output $V_O$ from each of the proximity switches 22, converts the analog signal to a digital signal, and provides the digital signal to the microprocessor 42. Additionally, controller 40 includes a pulse counter 46 coupled to the microprocessor 42. The pulse counter 46 counts the charge signal pulses that are applied to each drive electrode of each proximity sensor, performs a count of the pulses needed to charge the capacitor until the voltage output $V_O$ reaches a predetermined voltage, and provides the count to the microprocessor 42. The pulse count is indicative of the change in capacitance of the corresponding capacitive sensor. The controller 40 is further shown communicating with a pulse width modulated drive buffer 15. The controller 40 provides a pulse width modulated signal to the pulse width modulated drive buffer 15 to generate a square wave pulse train $V_I$ which is applied to each drive electrode of each proximity sensor/switch 22. The controller 40 processes one or more control routines, shown in one embodiment including control routine 100 stored in memory to monitor and make a determination as to activation of one of the proximity switches.

The control routine 100 processes the various proximity switches 22 and performs a method of sensing user input on the sensors and determining activation of a proximity switch associated with the proximity switch assembly 20. The method includes the steps of generating an activation field with each of a plurality of proximity sensors, and detecting a signal from each of a plurality of proximity sensors associated with the proximity switches due to presence of an object such as a user. According to one embodiment, the control routine detects whether an object is pressed on or in contact with a resting pad, and allows activation of a switch when the switch is activated and an object is detected on the resting pad. According to another embodiment, the control routine detects whether an object is pressed on or in contact with the resting pad and prohibits activation of a switch when an object is detected on the resting pad. According to a further embodiment, the control routine detects when the signal amplitude for signals associated with two adjacent neighboring switches exceeds a threshold value indicative of an object on or very near the ridge located between the neighboring switches, and prevents activation of the neighboring switches in that situation.

Figure 8:
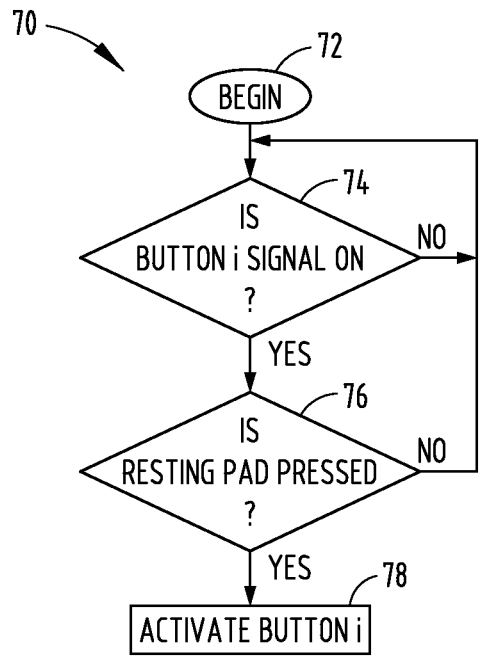
FIG. 8 is a flow diagram illustrating a routine for activating a proximity switch, according to a first embodiment.

Referring to FIG. 8, a routine 70 is illustrated for activating a proximity switch based on actuation of a resting pad, according to a first embodiment. In this embodiment, the switch assembly 20 may be configured such as that shown in FIG. 2 or FIG. 4, having a resting pad. As seen in FIG. 2, the resting pad includes two pads P1 and P2. Routine 70 begins at step 72 and proceeds to decision step 74 to determine if a button i signal is on due to presence of a first object, and, if not, returns to the beginning. If a button i signal is determined to be on, routine 70 proceeds to decision step 76 to determine if a resting pad is depressed by a second object and, if not, returns to the beginning. If a resting pad is determined to be pressed, routine 70 proceeds to step 78 to activate the switch for button i. According to this embodiment, a user must activate a resting pad and one of the proximity switches in order to actuate the intended proximity switch. Thus, the resting pad serves as a safing feature that requires both activation of the resting pad and a switch to activate that switch.

Figure 9:
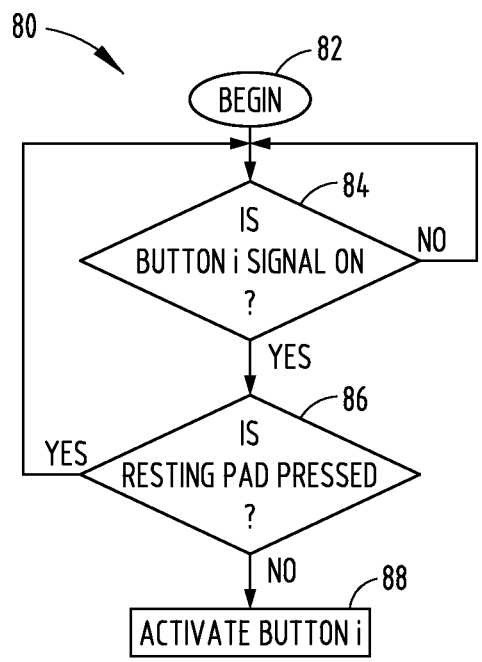
FIG. 9 is a flow diagram illustrating a routine for activating a proximity switch, according to a second embodiment.

Referring to FIG. 9, routine 80 is illustrated for controlling activation of a proximity switch based on a resting pad not being pressed, according to a second embodiment. In this embodiment, routine 80 begins at step 82 and proceeds to decision step 84 to determine if button i signal is on and, if not, returns to the beginning. If the button i signal is determined to be on, routine 80 proceeds to decision step 86 to determine if a resting pad is pressed and, if so, returns to step 84. If a resting pad is determined not to be pressed, routine 80 proceeds to activate button i at step 88. Thus, in this embodiment, activation of a switch requires that the resting pad is not pressed. If a finger or hand or other object is on the resting pad, the proximity switches are prevented from being activated. This routine 80 may apply where it is presumed that a large object, such as a hand is placed on the proximity switch assembly, in which case, an unintended actuation of a signal switch is prevented.

Figure 10:
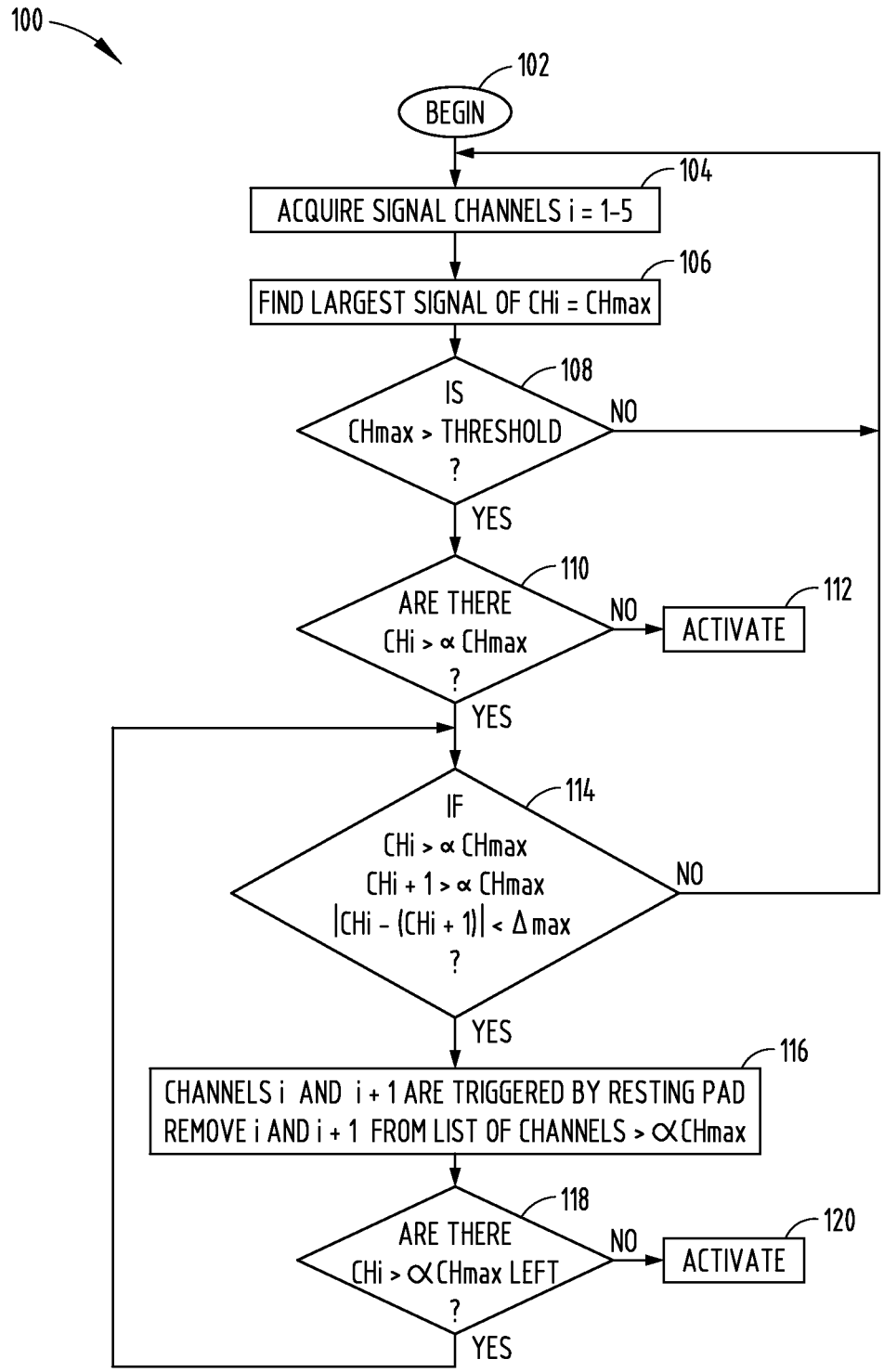
FIG. 10 is a flow diagram illustrating a routine for activating a proximity switch, according to a third embodiment.

Referring to FIG. 10, a routine 100 is illustrated for activating a switch based on sensed signals from as proximity sensors associated with adjacent neighboring proximity switches which are separated by a ridge, and preventing activation of the adjacent switches when an object is detected to be on a tactile feature, such as a ridge, between the adjacent proximity switches. Control routine 100 may be implemented in any of the embodiments shown in FIGS. 2-4 by processing signals associated with adjacent neighboring proximity switches 22 which are separated by a tactile feature, such as a ridge. Routine 100 begins at step 102 and proceeds to step 104 to acquire signal channels i=1-5. Next, at step 106, routine 100 finds the largest signal of channel CH1=CHmax. Routine 100 then proceeds to decision step 108 to determine if CHmax is greater than a threshold and, if not, returns to step 104. If CHmax is greater than a threshold, routine 100 proceeds to step 110 to determine if any channels CH i are greater than α×CHmax, where α is a multiplication factor such as 0.5, according to one example. Thus, step 110 looks for any signal channels having a value within fifty percent (50%) of the maximum signal. If there are no other signal channels that are greater than fifty percent (50%) of the maximum signal, then routine 100 proceeds to activate the switch having the maximum signal channel.

If there are other signal channels greater than α×CHmax, then routine 100 proceeds to decision step 114 to determine the following: if the signal channel is greater than α×CHmax; and if the adjacent neighboring channels CH i+1 is greater than α×CHmax; and if the absolute value of the current channel (CHi) minus the neighboring channel (CHi+1) is less than Δmax, indicative that the signal values for adjacent channels are sufficiently close. If any of the conditions in decision step 114 are not met, routine 100 returns to step 104. If all of the conditions in step 114 are met, routine 100 proceeds to step 116 to determine that the signal channels for the current switch and the neighboring switch are triggered by an object on a resting pad, which is the tactile feature or ridge disposed therebetween, and removes the current switch and neighboring switch from the selectable list of signal channels greater than α×CHmax, such that when an object is detected on the tactile feature, the switches associated with the neighboring channels are prevented from activation. Routine 100 then proceeds to decision step 118 to determine if there are any other channels greater than α×CHmax that are left and, if not, activates the current switch at step 120. Otherwise, routine 100 returns to step 114.

Routine 100 may further process signals associated with buttons B1-B5 and proximity sensor B6 as shown in the embodiment of FIG. 4. In doing so, signals associated with each of buttons B1-B5 may be compared to the signal associated with proximity sensor B6 to determine whether an object is resting on pad P between buttons B1-B5 and sensor B6. According to one embodiment, detection of an object on pad P may allow activation of one of the proximity switches. According to another embodiment, detection of an object on pad P may prevent activation of all of the proximity switches.

Figure 11:
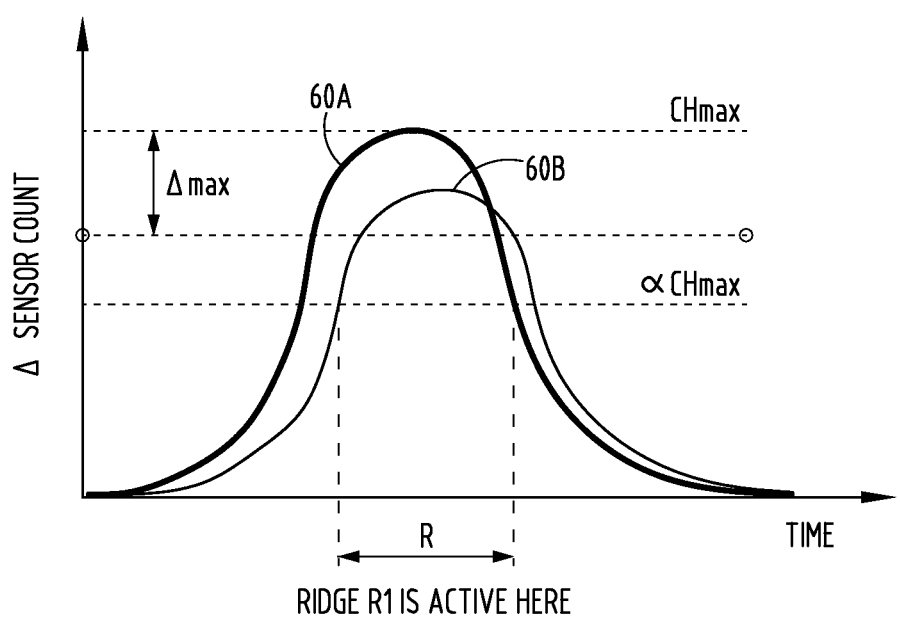
FIG. 11 is a graph illustrating signals associated with two neighboring proximity switches when an object contacts a ridge between the two switches.

Referring to FIG. 11, the change in sensor charge pulse counts shown as Δ sensor count for a signal associated with each of a pair of adjacent proximity switches 22 shown in FIGS. 5 and 10 is illustrated, according to one example. The change in sensor charge pulse count (Δ sensor count) is the difference between an initialized referenced count value without any finger or other object present in the activation field and the corresponding sensor reading. In this example, the user's finger enters the activation field 32 associated with a first proximity switch 22 as the user's finger moves across the switch. The signals shown by lines 60A and 60B are the changes (Δ) in sensor charge pulse count associated each of two neighboring capacitive sensors 24 for neighboring switches 22. In the disclosed embodiment, the proximity sensors 24 are capacitive sensors. When a user's finger is in contact with or close proximity of the sensor 24, the finger alters the capacitance measured at the corresponding sensor 24. The capacitance is in parallel to the untouched sensor pad parasitic capacitance, and as such, measures as an offset. The user or operator induced capacitance is proportional to the user's finger or other body part dielectric constant, the surface exposed to the capacitive pad, and is inversely proportional to the distance of the user's limb to the switch button. According to one embodiment, each sensor is excited with a train of voltage pulses via pulse width modulation (PWM) electronics until the sensor is charged up to a set voltage potential. Such an acquisition method charges the receive electrode to a known voltage potential. The cycle is repeated until the voltage across the measurement capacitor reaches a predetermined voltage. Placing a user's finger on the touch surface of the switch 22 introduces external capacitance that increases the amount of charge transferred each cycle, thereby reducing the total number of cycles required for the measurement capacitance to reach the predetermined voltage. The user's finger causes the change in sensor charge pulse count to increase since this value is based on the initialized reference count minus the sensor reading.

As seen in FIG. 11, signal 60A associated with a first capacitive switch, such as button B1 shown in FIG. 5, is shown rising up to a maximum value CHmax. Lagging in time is a second signal 60B associated with the adjacent neighboring proximity switch, such as button B2, which also rises up and exceeds threshold $\alpha \times$CHmax, where $\alpha$ is a multiplier is less than 1.0, such as 0.75-0.50, for example. When signals 60A and 60B are close in value within $\Delta$max, then the routine looks for an object resting on the ridge. Signals 60A and 60B simultaneously exceed the $\alpha \times$CHmax threshold for a period of time labeled R during which the control routine determines that an object is resting on the tactile feature shown as ridge R1 disposed between buttons B1 and B2. When this occurs, it is determined that the object is on the ridge, such that activation of either of the adjacent neighboring switches B1 and B2 is prevented from activation. Thus, inadvertent actuations of the switches is prevented whenever an object is detected to be on the tactile feature.

Accordingly, the proximity switch assembly and method advantageously determines activation of the proximity switches based on a tactile feature such as a ridge or resting pad. The system and method advantageously allows for a user to explore the proximity switch pads which can be particularly useful in an automotive application where driver distraction can be avoided.

It is to be understood that variations and modifications can be made on the aforementioned structure without departing from the concepts of the present invention, and further it is to be understood that such concepts are intended to be covered by the following claims unless these claims by their language expressly state otherwise.

We claim:

1. A proximity switch assembly comprising:
    a first proximity switch comprising a first proximity sensor;
    a second proximity switch comprising a second proximity sensor;
    a tactile feature disposed between the first and second proximity switches; and
    control circuitry detecting an object on the tactile feature based on sensed signals from the first and second proximity sensors and preventing activation of the first and second switches when an object is detected on the tactile feature.

2. The proximity switch assembly of claim 1, wherein the tactile feature comprises an outward extending member.

3. The proximity switch assembly of claim 2, wherein the outward extending member comprises a ridge.

4. The proximity switch assembly of claim 1, wherein the control circuitry activates the first proximity switch based on a signal associated with the first proximity sensor exceeding a threshold when no object is detected on the tactile feature.

5. The proximity switch assembly of claim 1 further comprising a resting pad comprising a third sensor for sensing an object on a resting pad, wherein the control circuitry determines activation of one of the first and second proximity switches based on detection of an object on the resting pad.

6. The proximity switch assembly of claim 5, wherein the control circuitry allows activation of one of the first and second proximity switches when an object is detected on the resting pad.

7. The proximity switch assembly of claim 5, wherein the control circuitry prevents activation of the first and second proximity switches when an object is detected on the resting pad.

8. The proximity switch assembly of claim 1, wherein each of the first and second proximity sensors comprises a capacitive sensor.

9. The proximity switch assembly of claim 1, wherein the proximity switch assembly is employed on a vehicle.

10. A proximity switch assembly comprising:
    a first proximity switch comprising a first sensor;
    a resting pad comprising a second sensor for sensing an object on the resting pad; and
    control circuitry detecting a first object with the first proximity sensor and a second object on the resting pad and determining activation of the first proximity switch based on detection of the first and second objects.

11. The proximity switch assembly of claim 10 further comprising a second proximity switch comprising a third proximity sensor, and a tactile feature disposed between the first and second proximity switches, wherein the control circuitry detects an object on the tactile feature based on sensed signals from the first and third proximity sensors and prevents activation on the first and second switches when an object is detected on the tactile feature.

12. The proximity switch assembly of claim 11, wherein the control circuitry prevents activation of the first and second proximity switches when an object is detected on the tactile feature.

13. The proximity switch assembly of claim 11, wherein the control circuitry allows activation of the first and second proximity switches when an object is detected on the tactile feature.

14. The proximity switch assembly of claim 11, wherein the tactile feature comprises an outward extending member.

15. The proximity switch assembly of claim 14, wherein the outward extending member comprises a ridge.

16. The proximity switch assembly of claim 10, wherein the first proximity sensor comprises a capacitive sensor.

17. The proximity switch assembly of claim 10, wherein the proximity switch assembly is employed on the vehicle.

18. A method of controlling activation of proximity switches comprising:
    sensing a first signal associated with a first sensor for a first proximity switch;
    sensing a second signal associated with a second sensor for a second proximity switch;

detecting an object on a tactile feature disposed between the first and second proximity switches based on the first and second signals; and controlling activation of the first and second switches based on the detected object.

19. The method of claim 18, wherein the step of controlling activation of the first and second switches comprises preventing activation of the first and second switches, when an object is detected on the tactile feature.

20. The method of claim 18 further comprising the step of sensing an object on a resting pad comprising a third sensor and determining activation of one of the first and second proximity switches based on detection of an object on the resting pad.

\* \* \* \* \*